United States Patent
Matsumura et al.

(10) Patent No.: US 7,508,081 B2
(45) Date of Patent: Mar. 24, 2009

(54) DICING DIE-BONDING FILM

(75) Inventors: Takeshi Matsumura, Ibaraki (JP); Masaki Mizutani, Ibaraki (JP); Sadahito Misumi, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 511 days.

(21) Appl. No.: 11/082,112

(22) Filed: Mar. 16, 2005

(65) Prior Publication Data

US 2005/0208736 A1 Sep. 22, 2005

(30) Foreign Application Priority Data

Mar. 17, 2004 (JP) .............................. 2004-076732

(51) Int. Cl.
*H01L 29/40* (2006.01)
(52) U.S. Cl. ................ 257/782; 438/113; 257/E21.505
(58) Field of Classification Search .............. 211/126.1, 211/41.18; 428/355 AC, 40.1, 414, 473.5, 428/66, 113–114, 118, 654, 464, 459–460; 257/40, 232, 415, 753, 782

See application file for complete search history.

(56) References Cited

U.S. PATENT DOCUMENTS

| | | | |
|---|---|---|---|
| 4,664,739 A | 5/1987 | Aurichio | |
| 4,687,693 A | 8/1987 | Sheyon et al. | |
| 4,961,804 A | 10/1990 | Aurichi | |
| 5,098,501 A | 3/1992 | Nishiguchi | |
| 5,304,418 A | 4/1994 | Akada et al. | |

(Continued)

FOREIGN PATENT DOCUMENTS

EP 0 150 882 A1 8/1985

(Continued)

OTHER PUBLICATIONS

U.S. Appl. No. 10/678,855, filed Oct. 3, 2003, Takeshi Matsumura et al.

(Continued)

*Primary Examiner*—Charles D. Garber
*Assistant Examiner*—André Stevenson
(74) *Attorney, Agent, or Firm*—Knobbe Martens Olson & Bear LLP

(57) ABSTRACT

The invention relates to a dicing die-bonding film having a pressure-sensitive adhesive layer (2) on a substrate material (1) and a die-bonding adhesive layer (3) on the pressure-sensitive adhesive layer (2), wherein the adhesion of the pressure-sensitive adhesive layer (2) to the die-bonding adhesive layer (3), as determined under the conditions of a peel angle of 15° and a peel point moving rate of 2.5 mm/sec. at 23° C., is different between a region (2*a*) corresponding to a work attachment region (3*a*) and a region (2*b*) corresponding to a part or the whole of the other region (3*b*), in the die-bonding adhesive layer (3), and satisfies the following relationship: adhesion of the pressure-sensitive adhesive layer (2*a*)<adhesion of the pressure-sensitive adhesive layer (2*b*), and the adhesion of the pressure-sensitive adhesive layer (2*a*) to the die-bonding adhesive layer (3) is not higher than 2.3 N/25 mm. There is thus provided the dicing die-bonding film that is excellent in balance between retention during dicing of the thin work and releasability of its diced chipped work together with the die-bonding adhesive layer, even if a work is thin.

12 Claims, 3 Drawing Sheets

U.S. PATENT DOCUMENTS

| | | | |
|---|---|---|---|
| 5,476,565 | A | 12/1995 | Akada et al. |
| 5,525,422 | A | 6/1996 | Spies et al. |
| 5,705,016 | A | 1/1998 | Senoo et al. |
| 5,844,348 | A | 12/1998 | Gamo |
| 5,888,606 | A | 3/1999 | Snoo et al. |
| 6,007,920 | A | 12/1999 | Umehara et al. |
| 6,140,151 | A | 10/2000 | Spies et al. |
| 6,171,163 | B1 | 1/2001 | Seko et al. |
| 6,245,593 | B1 | 6/2001 | Yoshihara et al. |
| 6,258,426 | B1 | 7/2001 | Yamamoto et al. |
| 6,398,892 | B1 | 6/2002 | Noguchi et al. |
| 6,457,220 | B1 | 10/2002 | Hamano |
| 6,528,330 | B2 | 3/2003 | Iketani |
| 6,548,327 | B2 * | 4/2003 | De Pauw et al. ............ 438/118 |
| 6,938,783 | B2 * | 9/2005 | Chung .................... 211/41.18 |
| 6,977,024 | B2 | 12/2005 | Yamazaki et al. |
| 7,054,161 | B1 | 5/2006 | James |
| 7,060,339 | B2 | 6/2006 | Matsumura et al. |
| 7,147,920 | B2 * | 12/2006 | Shiobara et al. ............ 428/414 |
| D549,189 | S | 8/2007 | Misumi et al. |
| 7,309,925 | B2 | 12/2007 | Matsumura et al. |
| 2002/0001670 | A1 * | 1/2002 | Pauw et al. .................. 427/98 |
| 2002/0014465 | A1 * | 2/2002 | Chung .................... 211/126.1 |
| 2002/0042189 | A1 | 4/2002 | Tanaka |
| 2003/0207479 | A1 | 11/2003 | Border et al. |
| 2003/0226640 | A1 | 12/2003 | Yamazaki et al. |
| 2004/0105990 | A1 * | 6/2004 | Shiobara et al. .......... 428/473.5 |
| 2004/0241910 | A1 | 12/2004 | Matsumura et al. |
| 2005/0046042 | A1 | 3/2005 | Matsumura et al. |
| 2005/0139973 | A1 | 6/2005 | Matsumura et al. |
| 2005/0208736 | A1 | 9/2005 | Matsumura et al. |
| 2005/0224978 | A1 * | 10/2005 | Kawate et al. .............. 257/753 |
| 2006/0029762 | A1 * | 2/2006 | Chung ...................... 428/40.1 |
| 2006/0148131 | A1 | 7/2006 | Matsumura et al. |
| 2006/0257651 | A1 * | 11/2006 | Shintani ............... 428/355 AC |
| 2007/0137782 | A1 | 6/2007 | Matsumura et al. |
| 2008/0088036 | A1 | 4/2008 | Matsumura et al. |

FOREIGN PATENT DOCUMENTS

| | | |
|---|---|---|
| EP | 0 134 606 B1 | 3/1989 |
| EP | 0 550 014 A2 | 7/1993 |
| EP | 0 571 649 A1 | 12/1993 |
| EP | 0 588 180 A1 | 3/1994 |
| EP | 0 786 802 A2 | 7/1997 |
| EP | 0 792 756 A2 | 9/1997 |
| EP | 0 884 766 A2 | 12/1998 |
| EP | 0 976 802 A1 | 2/2000 |
| EP | 1 411 547 A2 | 4/2004 |
| EP | 1 482 546 A2 | 12/2004 |
| GB | 2 340 772 A | 3/2000 |
| JP | 60-57642 | 4/1985 |
| JP | 60-196956 | 10/1985 |
| JP | 61-263136 | 11/1986 |
| JP | 62-79649 | 4/1987 |
| JP | 1-268131 | 10/1989 |
| JP | 2-248064 | 10/1990 |
| JP | 2-265258 | 10/1990 |
| JP | 4-042555 | 2/1992 |
| JP | 5-78629 | 3/1993 |
| JP | 5-078629 | 3/1993 |
| JP | 7-263382 | 10/1995 |
| JP | 8-213349 | 8/1996 |
| JP | 10-335271 | 12/1998 |
| JP | 11-111162 | 4/1999 |
| JP | 2002-158276 | 5/2002 |
| JP | 2002-226800 | 8/2002 |
| JP | 2003-119438 | 4/2003 |
| JP | 2003-206468 | 7/2003 |
| JP | 2003-316031 A | 11/2003 |
| JP | 2003-56248 | 9/2004 |
| JP | 2004-349510 | 12/2004 |

OTHER PUBLICATIONS

European Search Report issued on the corresponding European Patent Application No. 05005884.1, dated Jun. 23, 2006.

Chinese Office Action issued on the related Chinese Patent Application No. 200410098297.6, dated Sep. 28, 2007.

Decision of Refusal issued on the related Japanese Patent Application No. 2003-152659, dated Oct. 30, 2007.

European Search Report issued on the related European Patent Application No. EP03023536, dated Jul. 27, 2004.

European Search Report issued on the related European Patent Application No. 03023536, dated Aug. 9, 2004.

European Search Report issued on the related European Patent Application No. EP04012260, dated Jan. 4, 2005.

European Search Report issued on the related European Patent Application No. 05 00 5884, dated Jun. 14, 2006.

File History of the related U.S. Appl. No. 10/849,414, as of Feb. 15, 2008.

File History of the related U.S. Appl. No. 11/369,931 as of Feb. 15, 2008.

File History of the related U.S. Appl. No. 11/671,982, as of Feb. 15, 2008.

File History of the related U.S. Appl. No. 11/947,727, as of Feb. 15, 2008.

File History of the related U.S. Appl. No. 29/225,424, as of Feb. 15, 2008.

Japanese Office Action issued on the related Japanese Patent Application No. 2003-431690, dated Jun. 26, 2007.

Japanese Office Action issued on the related Japanese Patent Application No. 2003-431690, dated Jan. 18, 2007.

Japanese Office Action issued on the related Japanese Patent Application No. 2003-431690, dated Oct. 30, 2007.

Notification of Reasons for Refusal issued on the related Japanese Patent Application No. 2003-152659, dated Sep. 27. 2006.

Written Opinion issued by the Austrian Patent Office on the related Singapore Patent Application No. 200402611-8, dated Apr. 13, 2007.

File History of the related U.S. Appl. No. 10/849,414, for the period of Feb. 16, 2008-Aug. 19, 2008.

File History of the related U.S. Appl. No. 11/947,727, for the period of Feb. 16, 2008-Aug. 19, 2008.

File History of the related U.S. Appl. No. 29/225,424, for the period of Feb. 16, 2008-Aug. 19, 2008.

* cited by examiner

DICING DIE-BONDING FILM

FIELD OF THE INVENTION

The present invention relates to a dicing die-bonding film. The dicing die-bonding film is used in dicing a work (semiconductor wafer or the like) on which an adhesive for fixing a chipped work (semiconductor chip or the like) to an electrode member was stuck before dicing. The present invention also relates to a method of fixing a chipped work by using the dicing die-bonding film. Further, the present invention relates to a semiconductor device having a chipped work adhesive-fixed thereon by the fixing method. For example, the dicing die-bonding film of the present invention can be applied to various works such as silicon semiconductors, compound semiconductors, semiconductor packages, glass and ceramics.

BACKGROUND OF THE INVENTION

A semiconductor wafer having a circuit pattern formed thereon is subjected if necessary to backside polishing to regulate the thickness and then subjected to dicing into a chipped work (dicing step). In the dicing step, the semiconductor wafer is washed generally at suitable fluid pressure (usually about 2 kg/cm$^2$) in order to remove off-cut. Then, the chipped work is fixed via an adhesive onto an adherend such as a lead frame (mounting step) and then subjected to a bonding step. In the mounting step, an adhesive has conventionally been applied on the lead frame or the chipped work. In this method, however, the adhesive layer is hardly uniformly applied, and the application of the adhesive requires a special device and is time-consuming. Accordingly, a dicing die-bonding film for retaining a semiconductor wafer via an adhesive in the dicing step and providing a chip-bonding adhesive layer necessary in the mounting step has been proposed (see, for example, JP-A 60-57642).

The dicing die-bonding film described in JP-A 60-57642 supra comprises an adhesive layer arranged releasably on a substrate material. That is, a semiconductor wafer retained by the adhesive layer is subjected to dicing, and the substrate material is stretched to release the resulting chipped works together with the adhesive layer therefrom, and each chipped work is recovered and then fixed via the adhesive layer to an adherend such as a lead frame.

The adhesive layer in this kind of dicing die-bonding film is desired to exhibit good retention of the semiconductor wafer as well as good releasability of the chipped work together with the adhesive layer from the substrate material after dicing in order to prevent problems such as dicing infeasibility and erroneous dimensions. However, these two features are hardly balanced. Particularly, when the adhesive layer requires high retention in a system of dicing a semiconductor wafer with a rotating round blade, it is difficult to obtain a dicing die-bonding film satisfying these features.

To overcome this problem, a wide variety of modifications have been proposed (see, for example, JP-A 2-248064). JP-A 2-248064 proposes a method of facilitating pickup of chipped works, which comprises sandwiching a UV radiation-curing pressure-sensitive adhesive layer between a substrate material and an adhesive layer and then curing it with UV rays after dicing to reduce the adhesion between the pressure-sensitive adhesive layer and the adhesive layer thereby releasing the layers from each other.

However, there is the case where even by this modification method, good balance between retention during dicing and releasability after dicing is hardly attained by the adhesive layer. For example, when a large chipped work of 10 mm×10 mm or more is to be obtained, easy pickup of the chipped work is infeasible with a general die bonder because of the large area of the work.

To solve this problem, the present applicant applied a dicing die-bonding film excellent in balance between the retention of a work during dicing and releasability of its diced chipped work together with a die-bonding adhesive layer (JP-A 2002-299930). Even in the pickup step using this dicing die-bonding film, a system of using a general dicing pressure-sensitive film is adopted. That is, the dicing die-bonding film is stretched to a certain extent, and the dicing die-bonding film below a chipped work to be picked up is raised or rubbed in a dotted or linear state to facilitate the release of the chipped work from the dicing die-bonding film, and the chipped work is picked up by upward vacuum adsorption. The dicing die-bonding film in the application supra can achieve excellent pickup.

In recent years, however, the works (semiconductor elements) are rendered thinner with spread of IC cards etc., and the chipped works are easily deformed (pliable) upon pickup by the technique described above, and the peel angle of the dicing die-bonding film to the chipped work tends to be reduced. As a result, the peeling strength is increased to hinder pickup.

The mechanism of pickup of thin chipped works is approximately estimated as follows: That is, when the thin chipped works are to be picked up, the dicing die-bonding film is raised with a raising pin to facilitate release, upon which the works are thin and poor in rigidity so that the edge of the works is deformed to make the peel angle between the dicing die-bonding film and the works lower than in the case of conventional thick works having rigidity, thus increasing the peeling strength to hinder pickup.

SUMMARY OF THE INVENTION

An object of the present invention is to provide a dicing die-bonding film having a pressure-sensitive adhesive layer on a substrate material and a die-bonding adhesive layer arranged releasably on the pressure-sensitive adhesive layer, which even if the work is thin, is excellent in balance between the retention of the thin work during dicing and the releasability of its diced chipped work together with the die-bonding adhesive layer.

Another object of the present invention is to provide a method of fixing a chipped work by using the dicing die-bonding film. A further object of the present invention is to provide a semiconductor device comprising a chipped work adhesive-fixed thereon by the fixing method.

As a result of extensive study to solve the problem described above, the present inventors found the following dicing die-bonding film, thus arriving at completion of the present invention.

That is, the present invention relates to a dicing die-bonding film having a pressure-sensitive adhesive layer (2) on a substrate material (1) and a die-bonding adhesive layer (3) on the pressure-sensitive adhesive layer (2), wherein the adhesion of the pressure-sensitive adhesive layer (2) to the die-bonding adhesive layer (3), as determined under the conditions of a peel angle of 15° and a peel point moving rate of 2.5 mm/sec. at 23° C., is different between a region (2a) corresponding to a work attachment region (3a) and a region (2b) corresponding to a part or the whole of the other region (3b), in the die-bonding adhesive layer (3), and satisfies the following relationship: adhesion of the pressure-sensitive adhesive layer (2a)<adhesion of the pressure-sensitive adhesive layer (2b), and the adhesion of the pressure-sensitive adhesive layer (2a) to the die-bonding adhesive layer (3) is not higher than 2.3 N/25 mm.

The dicing die-bonding film of the present invention has a pressure-sensitive adhesive layer (2) on a substrate material (1) and a die-bonding adhesive layer (3) arranged releasably on the pressure-sensitive adhesive layer (2). The pressure-sensitive adhesive layer (2) is designed such that the adhesions of the regions (2a and 2b) corresponding to the work attachment region (3a) and the other region (3b) in the die-bonding adhesive layer (3) to the die-bonding adhesive layer (3) satisfy the following relationship: adhesion of the pressure-sensitive adhesive layer (2a)<adhesion of the pressure-sensitive adhesive layer (2b). That is, the pressure-sensitive adhesive layer (2b) is designed to adhere suitably to the adhesive layer (3) upon dicing or expansion, thus preventing release of the adhesive layer (3) from the pressure-sensitive adhesive layer (2). On the other hand, the pressure-sensitive adhesive layer (2a) is designed to be easily releasable. Accordingly, there can be obtained a dicing die-bonding film by which even a large chip having dimensions exceeding 10 mm×10 mm can be subjected to dicing without failure, and after dicing, the resulting chipped work can be easily released and picked up. Thus, the dicing die-bonding film of the present invention attains good balance between retention during dicing and releasability during pickup.

Further, the adhesion of the pressure-sensitive adhesive layer (2) to the die-bonding adhesive layer (3) is as low as 2.3 N/25 mm or less even at a peel angle as low as 15°. Accordingly, even if the work is thin and easily deformable to decrease the peel angle during pickup, the chipped work can be excellently picked up. The adhesion is preferably not higher than 2.0 N/25 mm, more preferably not higher than 1.8 N/25 mm. To prevent chip scattering etc., the adhesion is preferably not lower than 0.1 N/25 mm, more preferably not lower than 0.3 N/25 mm.

In the dicing die-bonding film, the adhesions of the work attachment region (3a) in the die-bonding adhesive layer (3) to the work and to the pressure-sensitive adhesive layer (2a) preferably satisfy the following relationship: adhesion to the work>adhesion to the pressure-sensitive adhesive layer (2a).

The adhesion of the die-bonding adhesive layer (3) satisfies the above relationship between the work and the pressure-sensitive adhesive layer (2a), so that after dicing the work, the chipped work to which the die-bonding adhesive layer (3) has been stuck can be easily released from the pressure-sensitive adhesive layer (2a).

In the dicing die-bonding film, a part of the region (3b) other than the work attachment region (3a) can be a dicing ring attachment region (3b'). In the dicing die-bonding film, the adhesions of the dicing ring attachment region (3b') in the die-bonding adhesive layer (3) to the dicing ring and to the pressure-sensitive adhesive layer (2b') preferably satisfy the following relationship: adhesion to the dicing ring<adhesion to the pressure-sensitive adhesive layer (2b').

The adhesion of the die-bonding adhesive layer (3) satisfies the above relationship thereby improving the balance between retention during dicing and releasability during pickup.

Further, the present invention relates to another dicing die-bonding film having a pressure-sensitive adhesive layer (2) on a substrate material (1) and a die-bonding adhesive layer (3) on the pressure-sensitive adhesive layer (2), wherein the die-bonding adhesive layer (3) is arranged as a work attachment region (3a) on a part of the pressure-sensitive adhesive layer (2), and the adhesion of the pressure-sensitive adhesive layer (2) to the die-bonding adhesive layer (3), as determined under the conditions of a peel angle of 15° and a peel point moving rate of 2.5 mm/sec. at 23° C., is different between a region (2a) corresponding to the work attachment region (3a) and other region (2b), in the pressure-sensitive adhesive layer (2), satisfies the following relationship: adhesion of the pressure-sensitive adhesive layer (2a) <adhesion of the pressure-sensitive adhesive layer (2b), and the adhesion of the pressure-sensitive adhesive layer (2a) to the die-bonding adhesive layer (3) is not higher than 2.3 N/25 mm.

The another dicing die-bonding film of the present invention has a pressure-sensitive adhesive layer (2) on a substrate material (1) and a die-bonding adhesive layer (3) arranged releasably as a work attachment region (3a) on a part of the pressure-sensitive adhesive layer (2). The pressure-sensitive adhesive layer (2) is designed such that the adhesions of region (2a) corresponding to the work attachment region (3a) and other region (2b) satisfy the following relationship: adhesion of the pressure-sensitive adhesive layer (2a)<adhesion of the pressure-sensitive adhesive layer (2b). That is, the pressure-sensitive adhesive layer (2a) is designed to be easily releasable. On the other hand, the pressure-sensitive adhesive layer (2b) can bond a wafer ring and fix it so as not to be releasable upon dicing or expansion. Accordingly, there can be obtained a dicing die-bonding film by which even a large chip having dimensions exceeding 10 mm×10 mm can be subjected to dicing without failure, and after dicing, the resulting chipped work can be easily released and picked up. The another dicing die-bonding film of the present invention attains good balance between retention during dicing and releasability during pickup.

Further, the adhesion of the pressure-sensitive adhesive layer (2) to the die-bonding adhesive layer (3) is as low as 2.3 N/25 mm or less even at a peel angle as low as 15°. Accordingly, even if the work is thin and easily deformable to reduce the peel angle during pickup, the chipped work can be excellently picked up. The adhesion is preferably not higher than 2.0 N/25 mm, more preferably not higher than 1.8 N/25 mm. For preventing chip scattering etc., the adhesion is preferably not lower than 0.1 N/25 mm, more preferably not lower than 0.3 N/25 mm.

In the another dicing die-bonding film, the adhesions of the work attachment region (3a) to the work and to the pressure-sensitive adhesive layer (2a) preferably satisfy the following relationship: adhesion to the work>adhesion to the pressure-sensitive adhesive layer (2a).

The adhesion of the die-bonding adhesive layer (3a) satisfies the above relationship between the work and the adhesive layer (2a), so that after dicing the work, the chipped work to which the die-bonding adhesive layer (3a) has been stuck can be easily released from the pressure-sensitive adhesive layer (2a).

In the dicing die-bonding films (1) and (2), the pressure-sensitive adhesive layer (2) is formed preferably from a radiation-curing pressure-sensitive adhesive, and the pressure-sensitive adhesive layer (2a) corresponding to the work attachment region (3a) can be formed by irradiating the radiation-curing pressure-sensitive adhesive with radiations.

The radiation-curing pressure-sensitive adhesive used is preferably an adhesive comprising an acrylic polymer having a glass transition temperature of −70° C. or more. Preferably, the radiation-curing pressure-sensitive adhesive preferably comprises an acrylic polymer having a weight-average molecular weight of 500,000 or more. The radiation-curing pressure-sensitive adhesive is preferably the one containing 40 wt % or more of a radiation-curing resin containing 6 or more carbon-carbon double bonds on average in one molecule.

From the viewpoint of reducing the adhesion of the pressure-sensitive adhesive layer to the die-bonding adhesive, the tensile storage elastic modulus of the die-bonding adhesive layer (3) at 25° C. is preferably 50 MPa or more in the dicing die-bonding films before the die-bonding adhesive layer (3) is stuck to a chipped work etc., then stuck to a semiconductor element and finally fixed (for example by curing in the case of a thermosetting adhesive). The tensile storage elastic modulus is preferably 70 MPa or more, more preferably 80 MPa or more. From the viewpoint of attachment to the work, the tensile storage elastic modulus is preferably 2500 MPa or less, more preferably 1000 MPa or less, still more preferably 500 MPa or less.

The present invention also relates to a method of fixing a chipped work, which comprises the steps consisting of:

contact-bonding a work onto the die-bonding adhesive layer (3a) of the dicing die-bonding film described above, dicing the work into a chipped work, releasing the chipped work together with the die-bonding adhesive layer (3a) from the pressure-sensitive adhesive layer (2a), and adhesive-fixing the chipped work via the die-bonding adhesive layer (3a) onto a semiconductor element.

The method of fixing the chipped work is also preferable in the case where the thickness of the work is less than 100 μm. The method can also be carried out preferably in the case where the thickness of the work is less than 50 μm.

Further, the present invention relates to a semiconductor device comprising a chipped work adhesive-fixed via the die-bonding adhesive (3a) onto a semiconductor element by the above method of fixing a chipped work to a substrate or a chip.

BRIEF DESCRIPTION OF THE DRAWINGS

Further other objects, features and excellent aspects of the present invention will be sufficiently understood by the following description. The advantage of the present invention will be clarified by the following description with reference to the accompanying drawings.

DESCRIPTION OF THE EMBODIMENTS

Figure 1:
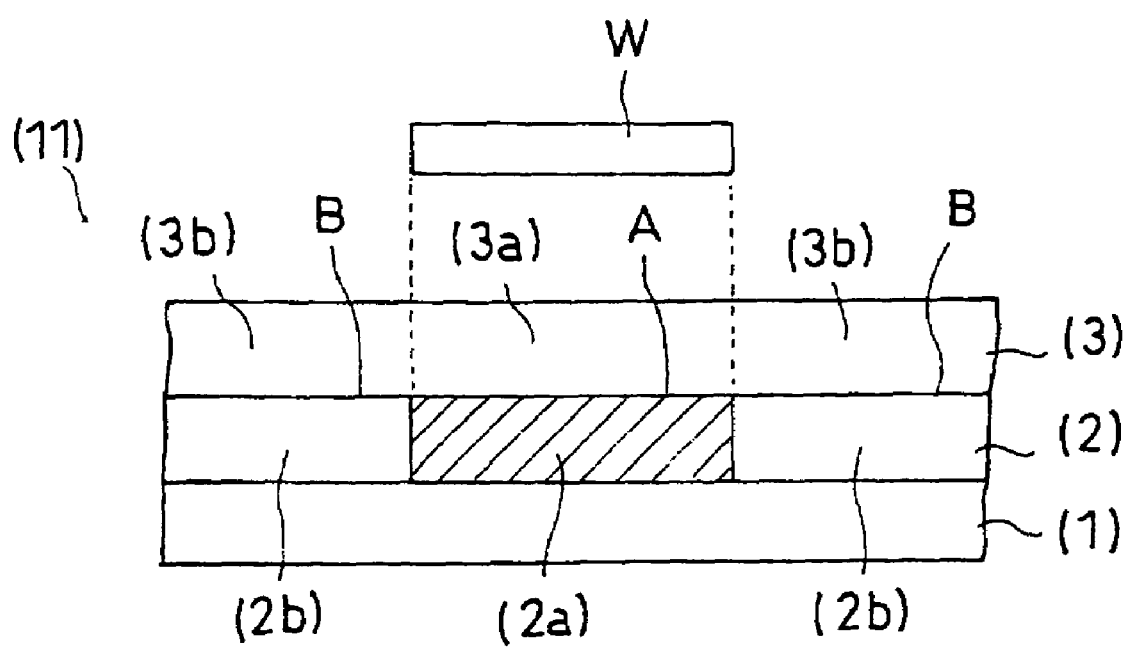
FIG. 1 is one example of a sectional view of the dicing die-bonding film (11) of the present invention.
Figure 2:
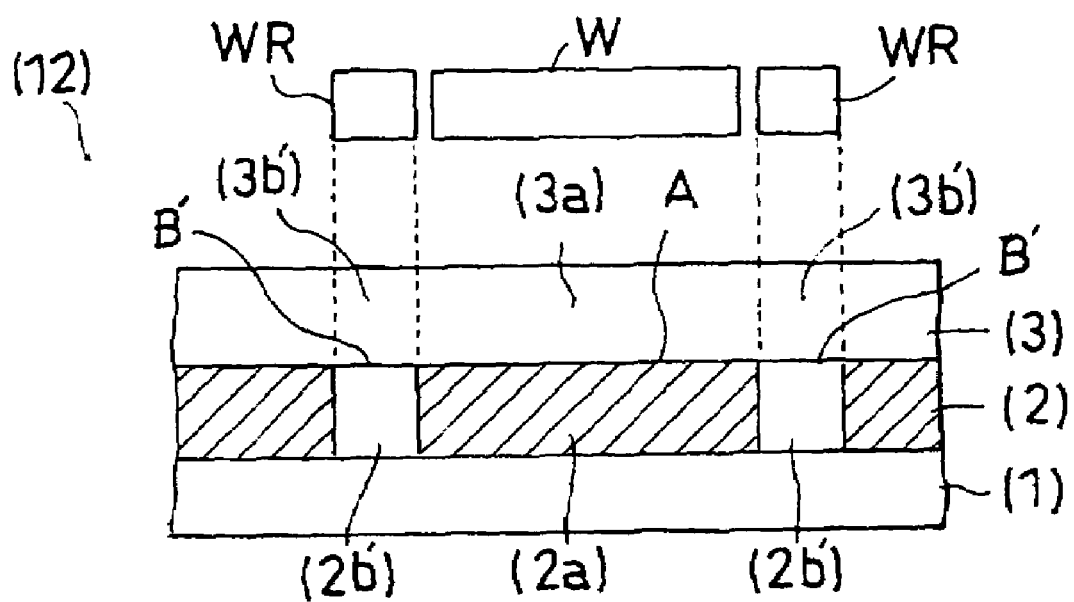
FIG. 2 is one example of a sectional view of the dicing die-bonding film (12) of the present invention.

Hereinafter, the dicing die-bonding film of the present invention is described by reference to the drawings. FIGS. 1 and 2 show one example of a sectional view of the dicing die-bonding film (11) of the present invention, which has a pressure-sensitive adhesive layer (2) on a substrate material (1) and a die-bonding adhesive layer (3) on the pressure-sensitive adhesive layer (2).

In FIG. 1, the respective regions (2a, 2b) are designed such that in interface (A) corresponding to the work attachment region (3a) and interface (B) corresponding to the other region (3b), the releasability of the pressure-sensitive adhesive layer (2) from the die-bonding adhesive layer (3) satisfies the following relationship: peel strength of the interface (A)>peel strength of the interface (B). The pressure-sensitive adhesive layer (2a) corresponds to the work attachment region (3a) and the pressure-sensitive adhesive layer (2b) corresponds to the other region (3b), in the die-bonding adhesive layer (3).

FIG. 2 shows an example where a part of the region (3b) corresponds to the dicing ring attachment region (3b'). That is, the peel strength of interface (B') between the dicing ring attachment region (3b') and its corresponding pressure-sensitive adhesive layer (2b') is designed to satisfy the following relationship: peel strength of interface (A)>peel strength of interface (B'). The pressure-sensitive adhesive layer (2) in FIG. 1 is the pressure-sensitive adhesive layer (2b) except for the pressure-sensitive adhesive layer (2a), but as shown in FIG. 2, a part of the region other than the pressure-sensitive adhesive layer (2a) can be the pressure-sensitive adhesive layer (2b).

Figure 3:
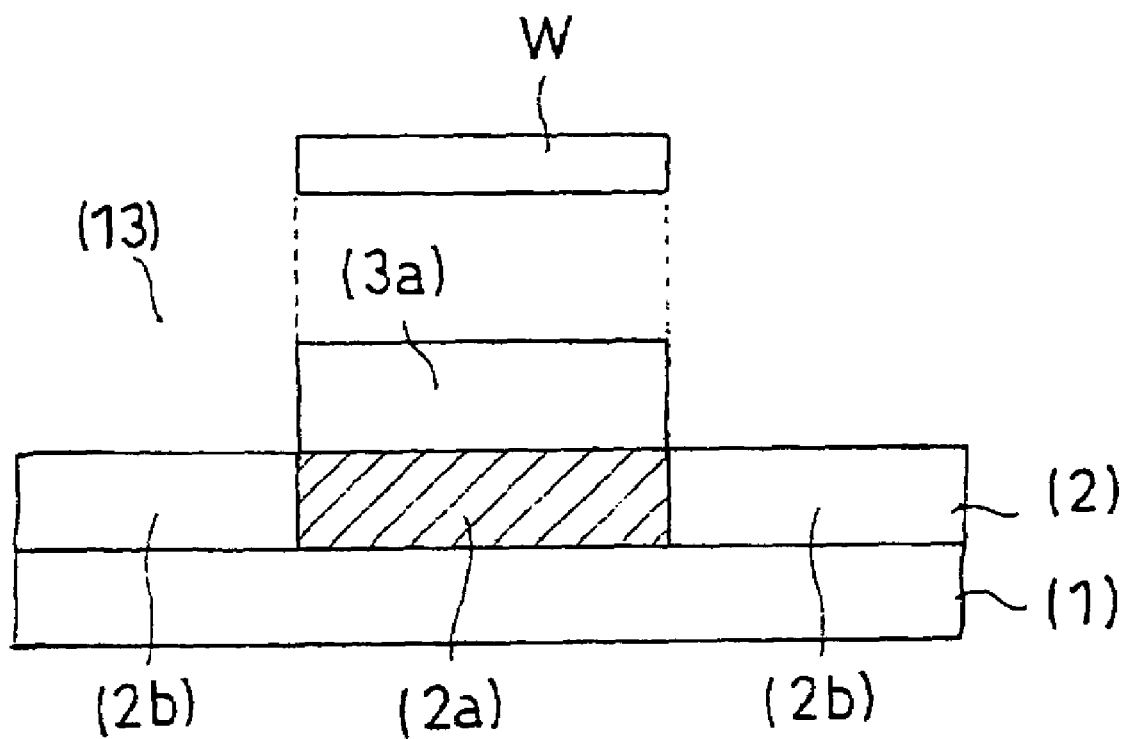
FIG. 3 is one example of a sectional view of the dicing die-bonding film (13) of the present invention.

FIG. 3 shows one example of a sectional view of the dicing die-bonding film (13) of the present invention, which has a pressure-sensitive adhesive layer (2) on a substrate material (1) and has a work attachment region (3a) on a part of the pressure-sensitive adhesive layer (2). The respective regions (2a, 2b) are designed such that in the pressure-sensitive adhesive layer (2), the region (2a) corresponding to the work attachment region (3a) and the other region (2b) are designed to satisfy the following relationship: adhesion of the pressure-sensitive adhesive layer (2a)<adhesion of the pressure-sensitive adhesive layer (2b).

The substrate material (1) confers strength on the dicing die-bonding film. Examples of the substrate material include polyolefins such as low-density polyethylene, linear polyethylene, middle-density polyethylene, high-density polyethylene, ultra-low-density polyethylene, random copolymerization polypropylene, block copolymerization polypropylene, homopolypropylene, polybutene, polymethyl pentene etc., polyesters such as ethylene/vinyl acetate copolymer, ionomer resin, ethylene/(meth)acrylic acid copolymer, ethylene/(meth)acrylate (random, alternating) copolymer, ethylene/butane copolymer, ethylene/hexene copolymer, polyurethane, polyethylene terephthalate, polyethylene naphthalate etc., polycarbonate, polyimide, polyether ether ketone, polyimide, polyether imide, polyamide, every aromatic polyamide, polyphenyl sulfide, aramid (paper), glass, glass cloth, fluorine resin, polyvinyl chloride, polyvinylidene chloride, cellulose resin, silicone resin, metal (foil), paper etc. The material of the substrate material includes polymers such as those crosslinked from the resin described above. The exemplary material constituting the substrate material may be used after grafting a functional group, a functional monomer or a modifying monomer onto it if necessary.

When the substrate material is composed of a plastic film, the plastic film may be used in a non-stretched form or after subjection if necessary to uniaxial or biaxial stretching treatment. According to a resin sheet endowed with thermal shrinkability by stretching treatment, the substrate material can be thermally shrunk after dicing thereby reducing the contact area between the pressure-sensitive adhesive layer (2a) and the adhesive layer (3a) to facilitate the recovery of chipped works.

The method of making a film of the substrate material can be carried out by a conventionally known film-making method. For example, calender film making, casting film making, inflation extrusion, T-die extrusion etc. can be preferably used. The surface of the substrate material can be subjected to ordinary surface treatment, for example chemical or physical treatment such as chromate treatment, ozone exposure, flame exposure, high-voltage electric shock exposure, ionization radiation treatment etc. or coating treatment such as a prime coating (for example, tacky substance described later) in order to increase the adhesiveness, retention etc. of its adjacent layer.

The same or different kinds of substrate material (1) can be suitably selected and used. The substrate material may be a single layer or multilayer or may be a blend substrate material having two or more kinds of resins dry-blended therein. The multilayer film can be produced from the above resin etc. by a conventional film lamination method such as co-extrusion method, dry lamination method etc. The substrate material (1) can be provided thereon with a evaporated layer of about 30 to 500 Å consisting of an electroconductive material such as a metal, an alloy and an oxide thereof in order to confer antistatic performance. The substrate material (1) may be a single layer or a multilayer consisting of two or more layers. When the pressure-sensitive adhesive layer (2) is a radiation-curing adhesive layer, the substrate material permitting radiations such as X-ray, UV ray, electron beam etc. to pass therethrough at least partially is used.

The thickness of the substrate material (1) can be suitably determined without particular limitation, and is generally preferably about 10 to 300 µm, more preferably 30 to 200 µm.

The pressure-sensitive adhesive used in formation of the pressure-sensitive adhesive layer (2) is not particularly limited, and is preferably a radiation-curing pressure-sensitive adhesive capable of easily giving a difference in adhesion between the pressure-sensitive adhesive layers (2a) and (2b). The radiation-curing pressure-sensitive adhesive can increase the degree of crosslinkage upon irradiation with radiations such as UV rays, to decrease its adhesion easily. Accordingly, the pressure-sensitive adhesive layer (2a) having significantly reduced adhesion can be easily formed by curing the radiation-curing pressure-sensitive adhesive layer corresponding to the work attachment region (3a). Because the adhesive layer (3) or (3a) is stuck on the pressure-sensitive adhesive layer (2a) having reduced adhesion by curing, the interface between the pressure-sensitive adhesive layer (2a) and the adhesive layer (3a) is inherently easily separated upon pickup. On the other hand, a region not irradiated with radiations has sufficient adhesion to form the pressure-sensitive adhesive layer (2b).

In the dicing die-bonding film (11) or (12), the pressure-sensitive adhesive layer (2b) formed by the uncured radiation-curing pressure-sensitive adhesive can adhere to the adhesive layer (3) to secure retention upon dicing. By the radiation-curing pressure-sensitive adhesive, the die-bonding adhesive layer (3) for fixing a chipped work (semiconductor chip etc.) to an adherend (referred to as semiconductor element) such as a substrate and a chipped work can be retained with good balance between adhesion and release. In the dicing die-bonding film (13), the pressure-sensitive adhesive layer (2b) can fix a wafer ring etc.

The radiation-curing pressure-sensitive adhesive used in formation of the pressure-sensitive adhesive layer (2) is not particularly limited insofar as it has a radiation-curing functional group such as carbon-carbon double bond and exhibits adhesiveness.

The radiation-curing pressure-sensitive adhesive can be exemplified by, for example, addition-type radiation-curing pressure-sensitive adhesives having radiation-curing monomer components and oligomer components incorporated into general pressure-sensitive adhesives such as the acrylic pressure-sensitive adhesive, rubber-based pressure-sensitive adhesive, silicone-based pressure-sensitive adhesive and polyvinyl ether-based pressure-sensitive adhesive. The pressure-sensitive adhesive is preferably an acrylic pressure-sensitive adhesive based on an acrylic polymer so that electronic parts such as semiconductor wafers and glass whose pollution is undesired can be subjected to washing and cleaning with ultra-pure water and an organic solvent such as alcohol.

The acrylic polymer includes, for example, acrylic polymers using, as a monomer component, one or more of alkyl (meth)acrylates (for example, C1 to C30, particularly C4 to C18, linear or branched alkyl esters such as methyl ester, ethyl ester, propyl ester, isopropyl ester, butyl ester, isobutyl ester, s-butyl ester, t-butyl ester, pentyl ester, isopentyl ester, hexyl ester, heptyl ester, octyl ester, 2-ethylhexyl ester, isooctyl ester, nonyl ester, decyl ester, isodecyl ester, undecyl ester, dodecyl ester, tridecyl ester, tetradecyl ester, hexadecyl ester, octadecyl ester, eicosyl ester etc.) and cycloalkyl (meth)acrylates (for example, cyclopentyl ester, cyclohexyl ester etc.). The (meth)acrylates refer to acrylates and/or methacrylates, and the term "(meth)" in the present invention is all used in this meaning. From the viewpoint of adhesion and release, the acrylic polymer preferably has a glass transition temperature of −70° C. or more, more preferably −60° C. or more, still more preferably −40° C. to −10° C. Accordingly, the main monomer forming the acrylic polymer is preferably a monomer giving a homopolymer having a glass transition temperature of −70° C. or more.

If necessary, the acrylic polymer may contain units corresponding to other monomer components copolymerizable with the alkyl (meth)acrylate or cycloalkyl ester, for the purpose of modification of flocculation, heat resistance etc. Such monomer components include, for example, carboxyl group-containing monomers such as acrylic acid, methacrylic acid, carboxyethyl (meth)acrylate, carboxypentyl (meth)acrylate, itaconic acid, maleic acid, fumaric acid, crotonic acid etc.; acid anhydride monomers such as maleic anhydride, itaconic anhydride etc.; hydroxyl group-containing monomers such as 2-hydroxyethyl (meth)acrylate, 2-hydroxypropyl (meth) acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, (4-hydroxymethylcyclohexyl) methyl (meth)acrylate etc.; sulfonic acid group-containing monomers such as styrenesulfonic acid, allylsulfonic acid, 2-(meth)acrylamide-2-methylpropanesulfonic acid, (meth)acrylamide propanesulfonic acid, sulfopropyl (meth)acrylate, (meth)acryloyloxynapthalenesulfonic acid etc.; phosphate group-containing monomers such as 2-hydroxyethyl acryloyl phosphate etc.; and glycidyl (meth)acrylate, (meth)acrylamide, N-hydroxymethyl (meth)acrylamide, alkyl amino alkyl (meth)acrylate (for example, dimethylaminoethyl methacrylate, t-butylaminoethyl methacrylate etc.), N-vinyl pyrrolidone, acryloyl morpholine, vinyl acetate, styrene, acrylonitrile etc. These copolymerizable monomer components can be used alone or as a mixture of two or more thereof. The use amount of these copolymerizable monomers is preferably 40 wt % or less based on the whole monomer components.

For crosslinking, the acrylic polymer can also contain multifunctional monomers if necessary as the copolymerizable monomer component. Such multifunctional monomers include hexane diol di(meth)acrylate, (poly)ethylene glycol di(meth)acrylate, (poly)propylene glycol di(meth)acrylate, neopentyl glycol di(meth)acrylate, pentaerythritol di(meth) acrylate, trimethylol propane tri(meth)acrylate, pentaerythritol tri(meth)acrylate, dipentaerythritol hexa(meth)acrylate, epoxy (meth)acrylate, polyester (meth)acrylate, urethane (meth)acrylate etc. These multifunctional monomers can also be used as a mixture of one or more thereof. From the viewpoint of adhesiveness etc., the use amount of the multifunctional monomer is preferably 30 wt % or less based on the whole monomer components.

The acrylic polymer is obtained by subjecting a single monomer or a mixture of two or more monomers to polymerization. The polymerization can be carried out in any system such as solution polymerization, emulsion polymerization, bulk polymerization, suspension polymerization etc. From the viewpoint of preventing contamination of a clean adherend, the content of a low-molecular compound is preferably lower. In this respect, the number-average molecular weight of the acrylic polymer is preferably 500,000 or more, more preferably about 800,000 to 3,000,000.

To increase the number-average molecular weight of the base polymer such as acrylic polymer etc., an external crosslinking agent can be suitably adopted in the pressure-sensitive adhesive. The external crosslinking method is specifically a reaction method that involves adding and reacting a crosslinking agent such as a polyisocyanate compound, epoxy compound, aziridine compound, melamine crosslinking agent, urea resin, anhydrous compound, polyamine, carboxyl group-containing polymer. When the external crosslinking agent is used, the amount of the crosslinking agent to be used is determined suitably depending on balance with the base polymer to be crosslinked and applications thereof as the pressure-sensitive adhesive. Generally, the external crosslinking agent is incorporated in an amount of about 5 parts by weight or less, more preferably 0.01 to 5 parts by weight, based on 100 parts by weight of the base polymer. The pressure-sensitive adhesive may be blended not only with the components described above but also with a wide variety of conventionally known additives such as a tackifier, aging inhibitor, filler and coloring agent if necessary.

The radiation-curing monomer component to be compounded includes, for example, polyvalent alcohol (meth) acrylates such as trimethylol propane tri(meth)acrylate, tetramethylol methane tetra(meth)acrylate, pentaerythritol tri(meth)acrylate, pentaerythritol tetra(meth)acrylate, dipentaerythritol monohydroxy penta(meth)acrylate, dipentaerythritol hexa(meth)acrylate, 1,4-butane diol di(meth)acrylate, tetraethylene glycol di(meth)acrylate, 1,6-hexane diol (meth)acrylate, neopentyl glycol di(meth)acrylate etc.; ester acrylate oligomers; and isocyanurates or isocyanurate compounds such as 2-propenyl-3-butenyl cyanurate, tris(2-methacryloxyethyl) isocyanurate etc. The radiation-curing oligomer component includes various acrylate oligomers such as those based on urethane, polyether, polyester, polycarbonate, polybutadiene etc., and their molecular weight is preferably in the range of about 100 to 30000.

The viscosity of the monomer components or oligomer components is not particularly limited. The radiation-curing monomer components or oligomer components may be used alone or as a mixture of two or more thereof. Depending on the type of the pressure-sensitive adhesive layer, the amount of the components to be compounded can be suitably determined such that the adhesion of the pressure-sensitive adhesive layer can be reduced. The amount of the radiation-curing monomer components and oligomer components to be compounded is not particularly limited, but for reducing adhesion at the time of pickup, that is, after irradiation with radiations, these components are compounded preferably in an amount of 40 to 75 wt %, more preferably 50 to 70 wt %, in the radiation-curing pressure-sensitive adhesive.

The radiation-curing pressure-sensitive adhesive includes an internal radiation-curing pressure-sensitive adhesive using a base polymer having a carbon-carbon double bond in a polymer side chain, in a main chain or at the end of the main chain, in addition to the addition-type radiation-curing pressure-sensitive adhesive described above. The internal radiation-curing pressure-sensitive adhesive does not require incorporation of low-molecular components such as oligomer components etc., or does not contain such compounds in a large amount, and thus the oligomer components etc. do not move with time through the pressure-sensitive adhesive, thus preferably forming the pressure-sensitive adhesive layer having a stabilized layer structure.

As the base polymer having a carbon-carbon double bond, a polymer having a carbon-carbon double bond and exhibiting tackiness can be used without particular limitation. Such base polymer is preferably a polymer having an acrylic polymer as a fundamental skeleton. The fundamental skeleton of the acrylic polymer includes the acrylic polymer illustrated above.

The method of introducing a carbon-carbon double bond into the acrylic polymer is not particularly limited, and various methods can be used, and the introduction of the carbon-carbon double bond into a polymer side chain is easy in molecular design. There is, for example, a method that after a monomer having a functional group is copolymerized with the acrylic polymer, a compound having a carbon-carbon double bond and a functional group capable of reacting with the above functional group is subjected to condensation or addition reaction therewith while the radiation-curing properties of the carbon-carbon double bond is maintained.

A combination of these functional groups includes combinations of carboxylic acid group and epoxy group, carboxylic acid group and aziridyl group, or hydroxy group and isocyanate group. Among these combinations of functional groups, the combination of hydroxyl group and isocyanate group is preferable for easiness of monitoring the reaction. The functional groups may be present in either the acrylic polymer or the above compound insofar as a combination of the functional groups forms the acrylic polymer having a carbon-carbon double bond, and in the preferable combination described above, it is preferable that the acrylic polymer has a hydroxyl group, and the above compound has an isocyanate group. In this case, the isocyanate compound having a carbon-carbon double bond includes, for example, methacryloyl isocyanate, 2-methacryloyloxyethyl isocyanate, m-isopropenyl-α,α-dimethyl benzyl isocyanate. As the acrylic polymer, copolymers of the above-mentioned hydroxy group-containing monomer and an ether compound such as 2-hydroxyethyl vinyl ether, 4-hydroxy butyl vinyl ether or diethylene glycol monovinyl ether are used.

As the internal radiation-curing pressure-sensitive adhesive, the base polymer having a carbon-carbon double bond (particularly acrylic polymer) can be used solely, but the radiation-curing monomer component and the oligomer component can also be compounded to such an extent that the features of the pressure-sensitive adhesive are not deteriorated. In the case of the internal radiation-curing pressure-sensitive adhesive, the base polymer having a carbon-carbon double bond is contained preferably in an amount of 40 wt % or more, more preferably 50 wt % or more.

For curing with UV rays, a photopolymerization initiator is incorporated into the radiation-curing pressure-sensitive adhesive. The photopolymerization initiator includes, for example, α-ketol compounds such as 4-(2-hydroxyethoxy)phenyl(2-hydroxy-2-propyl)ketone, α-hydroxy-α,α'-dimethyl acetophenone, 2-methyl-2-hydroxypropiophenone, 1-hydroxycyclohexyl phenyl ketone etc.; acetophenone compounds such as methoxyacetophenone, 2,2-dimethoxy-2-phenylacetophenone, 2,2-diethoxyacetophenone, 2-methyl-1-[4-(methylthio)-phenyl]-2-morpholinopropane-1 etc.; benzoin ether compounds such as benzoin ethyl ether, benzoin isopropyl ether, anisoin methyl ether etc.; ketal compounds such as benzyl dimethyl ketal etc.; aromatic sulfonyl chloride compounds such as 2-naphthalene sulfonyl chloride etc.; optically active oxime compounds such as 1-phenone-1,1-propanedione-2-(o-ethoxycarbonyl)oxime etc.; benzophenone compounds such as benzophenone, benzoylbenzoic acid, 3,3'-dimethyl-4-methoxybenzophenone etc.; thioxanthone compounds such as thioxanthone, 2-chlorothioxanthone, 2-methyl thioxanthone, 2,4-dimethyl thioxanthone, isopropyl thioxanthone, 2,4-dichlorothioxanthone, 2,4-diethyl thioxanthone, 2,4-diisopropyl thioxanthone etc.; camphor quinone; halogenated ketone; acyl phosphinoxide; acyl phosphonate etc. The amount of the photopolymerization initiator to be incorporated is for example about 0.1 to 10 parts by weight, preferably 0.5 to 5 parts by weight, based on 100 parts by weight of the base polymer such as acrylic polymer etc. constituting the pressure-sensitive adhesive.

The radiation-curing pressure-sensitive adhesive includes, for example, those disclosed in JP-A 60-196956, such as a rubber-based pressure-sensitive adhesive and an acrylic pressure-sensitive adhesive, comprising an addition-polymerizable compound having two or more unsaturated bonds, a photopolymerizable compound such as alkoxysilane having an epoxy group, and a photopolymerization initiator such as a carbonyl compound, an organic sulfur compound, a peroxide, an amine or an onium salt compound.

If necessary, the radiation-curing pressure-sensitive adhesive layer (2) can also contain a compound coloring upon irradiation with radiations. By incorporating the compound coloring upon irradiation with radiations into the pressure-sensitive adhesive layer (2), only a region irradiated with radiations can be colored. That is, the pressure-sensitive adhesive layer (2a) corresponding to the work attachment part (3a) can be colored. Accordingly, whether the pressure-sensitive adhesive layer (2) was irradiated with irradiations or not can be immediately judged by visual check, thus making the work attachment part (3a) easily recognizable and facilitating attachment of a work. Further, when a semiconductor element is to be detected with an optical sensor etc., its detection accuracy is increased and the semiconductor element can be picked up without error.

The compound coloring upon irradiation with radiations is a compound that is colorless or light-colored before irradiation with radiations and is colored upon irradiation with radiations. Preferable examples of such compounds include leuco dyes. As the leuco dyes, it is preferable to employ conventional leuco dyes based on triphenyl methane, fluoran, phenothiazine, auramine and spiropyran. Specific examples include
3-[N-(p-tolylamino)]-7-anilinofluoran,
3-[N-(p-tolyl)-N-methylamino]-7-anilinofluoran,
3-[N-(p-tolyl)-N-ethylamino]-7-anilinofluoran,
3-diethylamino-6-methyl-7-anilinofluoran, crystal violet lactone,
4,4',4"-tris-dimethyl aminotriphenyl methanol, and
4,4',4"-tris-dimethylaminotriphenyl methane.

A developer preferably used together with these leuco dyes includes electron acceptors such as conventionally used initial phenol formalin resin polymers, aromatic carboxylic acid derivatives, activated clay etc., and when the color tone is to be changed, a combination of various coloring agents can also be used.

The compound coloring upon irradiation with radiations may be dissolved once in an organic solvent or the like and then contained in the radiation-curing pressure-sensitive adhesive, or may be contained in a fine powdery form in the pressure-sensitive adhesive. It is desired that the amount of this compound to be used is 10 wt % or less, preferably 0.01 to 10 wt %, more preferably 0.5 to 5 wt %, based on the pressure-sensitive adhesive layer (2). When the amount of the compound is higher than 10 wt %, the compound absorbs considerable radiations with which the pressure-sensitive adhesive layer (2) is irradiated, resulting in insufficient curing of the pressure-sensitive adhesive (2a) thus failing to achieve sufficient reduction in adhesion in some cases. For sufficient coloration, on the other hand, the amount of the compound is preferably 0.01 wt % or more.

The pressure-sensitive adhesive layer (2) is arranged such that the adhesion of the pressure-sensitive adhesive layer (2a) is lower than the adhesion of the pressure-sensitive adhesive layer (2b). In the dicing die-bonding film (11) or (12), the releasability of the die-bonding adhesive layer (3) from the interface (A) is established to be greater than the releasability thereof from the interface (B). In the dicing die-bonding film (13), the adhesion of the pressure-sensitive adhesive layer (2a) is established to be lower than the adhesion of the pressure-sensitive adhesive layer (2b) where an SUS304 plate (#2000 polishing) is used as the adherend.

When the pressure-sensitive adhesive layer (2) is formed from a radiation-curing pressure-sensitive adhesive, there is a method wherein the radiation-curing pressure-sensitive adhesive layer (2) is formed on the substrate material (1) and then cured by partially irradiating, with radiations, the region corresponding to the work attachment region (3a), to form the pressure-sensitive adhesive layer (2a). The partial irradiation with radiations can be conducted via a photomask having a formed pattern corresponding to the region (3b etc.) other than the work attachment region (3a). Further, there is a method of curing by spot irradiation with UV radiations. Formation of the radiation-curing pressure-sensitive adhesive layer (2) can be carried out by transferring the layer (2) arranged on a separator onto the substrate material (1). The radiation-curing pressure-sensitive adhesive (2) arranged on a separator can also be subjected to curing by partial irradiation.

When the pressure-sensitive adhesive layer (2) is formed from a radiation-curing pressure-sensitive adhesive, the whole or a part of the region other than the region corresponding to the work attachment region (3a), on at least one side of the substrate material (1), is shielded from light, and the radiation-curing pressure-sensitive adhesive layer (2) is formed on the substrate material and then irradiated with radiations to cure the region corresponding to the work attachment region (3a), to form the pressure-sensitive adhesive layer (2a) having reduced adhesion. The light-shielding material can be formed by printing or vapor deposition of a material capable forming a photomask on a support film. According to this production method, the dicing die-bonding film of the present invention can be efficiently produced.

When curing inhibition occurs by oxygen upon irradiation with radiations, it is desired that the surface of the radiation-curing pressure-sensitive adhesive layer (2) be shielded from oxygen (air) by a certain method. For example, there is a method that involves covering the surface of the pressure-sensitive adhesive layer (2) with a separator or a method that involves irradiation with radiations such as UV rays in a nitrogen gas atmosphere.

The thickness of the pressure-sensitive adhesive layer, similar to the conventional dicing pressure-sensitive sheet, is 1 to 50 µm. When the thickness of the pressure-sensitive adhesive layer (2) is too thick, the dicing die-bonding film upon cutting is significantly vibrated to cause chipping easily, and thus the thickness is preferably 20 µm or less. On the other hand, when the thickness of the pressure-sensitive adhesive layer (2) is too thin, sufficient adhesion for retaining a semiconductor element during dicing is hardly obtained, and thus the thickness is preferably 3 μm or more. From these viewpoints, the thickness of the pressure-sensitive adhesive layer is particularly preferably 3 to 20 μm.

When a work (semiconductor wafer etc.) contact-bonded on the die-bonding adhesive layer (3) is diced into chips, the adhesive layer (3) is a layer adhering closely to and supporting the work and simultaneously functioning as an adhesive layer for fixing a chipped work (semiconductor chip etc.) as cut fragment to a semiconductor element (substrate, chip etc.) upon mounting the chipped work. It is particularly important that the die-bonding adhesive layer (3) has adhesiveness by which cut fragments are not scattered during dicing of the work. In the dicing die-bonding film (13), the die-bonding adhesive layer (3) is arranged as the previously formed work attachment region (3a).

The die-bonding adhesive layer (3) can be formed from a usual die adhesive. The die adhesive is preferably the one which can be formed into a sheet. As the die adhesive, for example, a die adhesive consisting of thermoplastic resin or thermosetting resin can be preferably used. The die adhesives can be used alone or as a mixture of two or more thereof. The die-bonding adhesive layer is preferably the one which can stick to a work such as a semiconductor wafer or to a dicing ring at a temperature of 70° C. or less. Further, the adhesive layer is preferably the one capable of sticking at ordinary temperatures.

The thermoplastic resin (thermoplastic die adhesive) to be used as the die adhesive includes, for example, saturated polyester resin, thermoplastic polyurethane resin, amide resin (nylon resin), imide resin etc. The thermosetting resin (thermosetting die adhesive) includes, for example, epoxy resin, unsaturated polyester resin, thermosetting acrylic resin, phenol resin etc. The thermosetting resin is preferably thermosetting resin which was rendered free from solvent, formed into sheet, and B-staged. A mixture of the thermosetting resin and thermoplastic resin can be used in a B-staged state. In the present invention, resins having a high glass transition temperature and based on silicone, rubber, urethane, imide and acryl can also be used as the die adhesive.

The die-bonding adhesive layer (3) may have a multilayer structure of two or more layers by suitably combining thermoplastic resins different in glass transition temperature and/or thermosetting resins different in thermosetting temperature. In the step of dicing the work (semiconductor wafer etc.), cutting water is used, and thus the die-bonding adhesive layer (3) absorbs moisture to have higher water content than under normal conditions in some cases. When the die-bonding adhesive layer containing water in such high content is stuck on a substrate or the like, water vapor may be accumulated on the adhesive interface in the stage of after-curing to cause lifting. Accordingly, the die-bonding adhesive layer is constituted such that a highly moisture-permeable film is sandwiched between the die adhesives, whereby water vapor can be diffused through the film in the stage of after-curing to prevent the problem. Accordingly, the die-bonding adhesive layer (3) may be composed of a multilayer structure having the adhesive layer, the film and the adhesive layer laminated in this order.

The thickness of the die-bonding adhesive layer (3) is not particularly limited, but is preferably about 5 to 100 μm, preferably about 10 to 50 μm.

Thus, the dicing die-bonding film (11), (12) or (13) which has the pressure-sensitive adhesive layer (2) on the substrate material (1), and has the die-bonding adhesive layer (3) on the pressure-sensitive adhesive layer (2) can be obtained.

The dicing die-bonding film (11), (12) or (13) can be endowed with antistatic performance for the purpose of preventing circuits from being broken due to generation of static electricity upon sticking or release or due to charging of a work (semiconductor wafer etc.) with the static electricity. The antistatic performance can be conferred by a suitable system, for example by adding an antistatic agent or an electroconductive material to the substrate material (1), the pressure-sensitive adhesive layer (2) or the adhesive layer (3) or by providing the substrate material (1) with an electroconductive layer consisting of a charge transfer complex, a metal film etc. These systems are preferably those hardly generating impurity ions which may denature semiconductor wafers. The electroconductive material (electroconductive filler) to be compounded for the purpose of conferring electrical conductivity and improving thermal conductivity includes spherical, needle-shaped or flaky metallic powder of silver, aluminum, gold, copper, nickel and electroconductive alloys, metal oxides such as alumina, amorphous carbon black, graphite etc.

In the dicing die-bonding films (1) and (2), the adhesions of the work attachment region (3a) to the work and to the pressure-sensitive adhesive layer (2a) are designed preferably such that the adhesion to the work is greater than the adhesion to the pressure-sensitive adhesive layer (2a). The adhesion to the work is regulated suitably depending on the type of the work.

When the region (3b) other than the work attachment region (3a) is used as the dicing attachment region (3b') in the dicing die-bonding film (11), the adhesions of the dicing attachment region (3b') in the die-bonding adhesive layer (3) to the work and to the pressure-sensitive adhesive layer (2b') are designed preferably such that the adhesion to the dicing ring is lower than the adhesion to the pressure-sensitive adhesive layer (2b'). The adhesion to the dicing ring is regulated suitably depending on the type of the dicing ring.

The die-bonding adhesive layer (3), (3a) in the dicing die-bonding film (11), (12) or (13) may be protected with a separator (not shown). That is, the separator may be arranged arbitrarily. The separator serves as a protecting material for protecting the die-bonding adhesive layer (3), (3a) before use, or has a function of labeling processing or a function of smoothing the pressure-sensitive adhesive. The separator can also be used as the substrate material for transferring the die-bonding adhesive (3), (3a) onto the pressure-sensitive adhesive layer (2). The separator is released when the work is stuck on the die-bonding adhesive layer (3), (3a) in the dicing die-bonding film (11), (12) or (13).

The material constituting the separator includes paper and synthetic resin film of polyethylene, polypropylene, polyethylene terephthalate or the like. The surface of the separator may be subjected if necessary to release treatment such as silicone treatment, long-chain alkyl treatment, fluorine treatment etc. for improving releasability from the pressure-sensitive adhesive layer. If necessary, the adhesive sheet may be subjected to UV protection treatment so that it does not react with environmental UV rays. The thickness of the separator is usually 10 to 200 μm, preferably about 25 to 100 μm.

After the separator arbitrarily arranged on the adhesive layer (3), (3a) is separated if necessary, the dicing die-bonding film (11), (12) or (13) of the present invention is used in the following manner. That is, a work is contact-bonded to the die-bonding adhesive layer (3a) in the dicing die-bonding film (11), (12) or (13), and the work is stuck and fixed to the adhesive layer (3a). Contact-bonding is carried out in a usual manner. The sticking temperature is not limited, but is preferably 20 to 80° C. In the present invention, a semiconductor wafer can be used preferably as the work. Then, the work is diced into chips. The work includes, for example, a semiconductor wafer, a multilayer substrate, an integrally-sealed module etc. In the present invention, the semiconductor wafer can be used preferably as the work.

By dicing with a suitable means such as a rotating round blade, the work together with the adhesive layer (3) is cut into chipped works (semiconductor chips etc.). That is, in the dicing step, the blade is rotated at high speed to cut the work into chipped works of predetermined size. It is possible to employ e.g. a cutting system called "full-cut" wherein cutting is carried out until the pressure-sensitive adhesive layer (2) is cut.

Then, the chipped work together with the die-bonding adhesive layer (3a) is released from the pressure-sensitive adhesive layer (2a). The chipped work thus picked up is then adhesive-fixed via the die-bonding adhesive layer (3a) to a semiconductor element as the adherend. The semiconductor element includes a lead frame, TAB film, substrate and a separately prepared chipped work. The adherend may be a deformable adherend which is easily deformed, or may be a non-deformable adherend (semiconductor wafer etc.) which is hardly deformed. The adherend is preferably a semiconductor wafer. When the adhesive layer (3), (3a) is thermally curable, the work can be stuck and fixed to the adherend by thermosetting, to improve resistance to heat. The chipped work stuck and fixed via the adhesive layer (3a) to a substrate etc. can be subjected to a reflow process.

Hereinafter, the present invention is described in more detail by reference to the Examples of the present invention. Hereinafter, the term "parts" means parts by weight. For irradiation with UV rays, UV irradiation unit NEL UM-110 (manufactured by Nitto Seiki Inc.) was used.

Glass transition temperature (also referred to hereinafter as Tg) is a value determined from $Tg_{1-n}$ of a homopolymer of each monomer and the weight fraction $W_{1-n}$ of each monomer, according to the equation $1/Tg = W_1/Tg_1 + \cdots + W_n/Tg_n$.

Conditions for Measurement of Molecular Weight

Weight-average molecular weight was determined as "TSK standard polystyrene" equivalent molecular weight by measurement under the following conditions. GPC unit: HLC-8120GPC column manufactured by Tosoh; columns, TSK gel GMH(S)×2 columns; size, 7.8 ml; I.D., ×300 mm; flow rate, 0.5 ml/min; detector, RI; injection volume, 100 µl; column temperature, 40° C.; and eluent, tetrahydrofuran.

PRODUCTION EXAMPLE 1

(Substrate Material)

As the substrate material, linear low-density polyethylene of 70 µm in thickness was used. One side of this film was subjected to corona treatment.

(Preparation of Radiation-Curing Acrylic Pressure-Sensitive Adhesive)

70 parts of butyl acrylate (Tg in homopolymer, −55° C.), 30 parts of ethyl acetate (Tg in homopolymer, −21° C.) and 5 parts of acrylic acid (Tg in homopolymer, 106° C.) were copolymerized in a usual manner in ethyl acetate to give a solution of an acrylic polymer at a concentration of 30 wt % having a weight-average molecular weight of 800,000. The glass transition temperature of the acrylic polymer was −4.5° C. To this acrylic polymer solution were added 20 parts of dipentaerythritol monohydroxy pentaacrylate, 3 parts of a photopolymerization initiator (trade name: Irgacure 651, manufactured by Ciba Specialty Chemicals Inc.), 0.5 parts of an epoxy compound (trade name: Tetrad C, manufactured by Mitsubishi Gas Chemical Company, Inc.) and 2 parts of a polyisocyanate compound (trade name: Colonate L, manufactured by Nippon Polyurethane Industry Co., Ltd.), whereby an acrylic pressure-sensitive adhesive solution was obtained.

(Preparation of Adhesive Film)

The radiation-curing acrylic pressure-sensitive adhesive solution described above was applied onto the corona-treated surface of the substrate material and dried at 80° C. for 10 minutes to form a pressure-sensitive adhesive layer of 5 µm in thickness. Then, only a wafer attachment region on the pressure-sensitive adhesive layer was irradiated with UV rays at 500 mJ/cm$^2$ (total amount of UV rays), to give a film having the pressure-sensitive adhesive layer wherein the wafer attachment corresponding region was cured with radiations. Hereinafter, this product is referred to as adhesive film A.

PRODUCTION EXAMPLE 2

(Substrate Material)

A polyethylene film of 80 µm in thickness was used as the substrate material.

(Preparation of Radiation-Curing Acrylic Pressure-Sensitive Adhesive)

A composition consisting of 50 parts by weight of ethyl acrylate (Tg in homopolymer, −21° C.), 50 parts of butyl acrylate (Tg in homopolymer, −55° C.) and 16 parts of 2-hydroxyethyl acrylate (Tg in homopolymer, −25° C.) were copolymerized in toluene to give a solution of an acrylic polymer at a concentration of 30 wt % having a weight-average molecular weight of 500,000. The glass transition temperature of the acrylic polymer was −37.5° C. This acrylic polymer solution was subjected to addition reaction with 20 parts of 2-methacryloyloxyethyl isocyanate to introduce a carbon-carbon double bond to a side chain of the polymer molecule. 100 parts (solids content) of this polymer was further compounded with 2 parts of a polyisocyanate-based crosslinking agent (trade name: Colonate L, manufactured by Nippon Polyurethane Industry Co., Ltd.) and 3 parts of a photopolymerization initiator (trade name: Irgacure 651, manufactured by Ciba Specialty Chemicals Inc.).

(Preparation of Adhesive Film)

The radiation-curing acrylic pressure-sensitive adhesive solution described above was applied onto the above substrate material and dried at 80° C. for 10 minutes to form a pressure-sensitive adhesive layer of 5 µm in thickness. Then, only a wafer attachment region on the pressure-sensitive adhesive layer was irradiated with UV rays at 500 mJ/cm$^2$ (total amount of UV rays), to give a film having the pressure-sensitive adhesive layer wherein the wafer attachment corresponding region was cured with radiations. Hereinafter, this product is referred to as adhesive film B.

PRODUCTION EXAMPLE 3

(Substrate Material)

A polyethylene film of 80 µm in thickness was used as the substrate material.

(Preparation of Radiation-Curing Acrylic Pressure-Sensitive Adhesive)

A composition consisting of 95 parts of 2-ethylhexyl acrylate (Tg in homopolymer, −85° C.) and 5 parts of acrylic acid (Tg in homopolymer, 106° C.) was copolymerized in an ethyl acetate solution to give a solution of an acrylic polymer at a concentration of 30 wt % having a weight-average molecular weight of 700,000. The glass transition temperature of the acrylic polymer was −65.2° C. To this acrylic polymer solution were added 130 parts of a radiation-curing oligomer (viscosity at 25° C., 10 Pa·sec) obtained by reacting dipentaerythritol acrylate with diisocyanate, 3 parts of a photopolymerization initiator (trade name: Irgacure 651, manufactured by Ciba Specialty Chemicals Inc.) and 5 parts of a polyisocyanate compound (trade name: Colonate L, manufactured by Nippon Polyurethane Industry Co., Ltd.), whereby an acrylic pressure-sensitive adhesive solution was obtained.

(Preparation of Adhesive Film)

The radiation-curing acrylic pressure-sensitive adhesive solution described above was applied onto the above substrate material and dried at 80° C. for 10 minutes to form a pressure-sensitive adhesive layer of 5 μm in thickness. Then, a wafer attachment corresponding region on the pressure-sensitive adhesive layer only was irradiated with UV rays at 500 mJ/cm$^2$ (total amount of UV rays), to give a film having the pressure-sensitive adhesive layer wherein the wafer attachment corresponding region was cured with radiations. Hereinafter, this product is referred to as adhesive film C.

PRODUCTION EXAMPLES A TO C (Preparation of Die-Bonding Adhesive Layers)

Each of the components consisting of the epoxy resin, phenol resin, synthetic rubber, inorganic filler and curing accelerator shown in Table 1 below was compounded in the ratio shown in the same table to prepare compositions of die-bonding adhesives A to C, and each composition was mixed with, and dissolved in, methyl ethyl ketone. The resulting mixture was applied onto a polyester film (separator) previously subjected to release treatment. Then, the polyester film coated with the mixture was dried at 120° C. to remove toluene, whereby die-bonding adhesive layers A to C of 20 μm in thickness in B-stage on the polyester film were obtained.

TABLE 1

| Composition | Die-bonding adhesive layer | | |
|---|---|---|---|
| | A | B | C |
| Epoxy resin (a1) | 21 | | |
| Epoxy resin (a2) | 21 | 14.1 | 41.4 |
| Phenol resin (b1) | | 8.1 | |
| Phenol resin (b2) | 37 | | 37.6 |
| Synthetic rubber | 20 | 5.6 | 20 |
| Inorganic filler | | 72 | |
| Curing accelerator | 1 | 0.28 | 10 |
| Tensile storage elastic modulus (MPa) | 100 | 2000 | 10 |

In Table 1, <Epoxy resin (a1)>Novolac epoxy resin (epoxy equivalent, 195 g/eq.; softening point, 80° C.; viscosity, 0.08 Pa·s/150° C.), <Epoxy resin (a2)>Bisphenol A epoxy resin (epoxy equivalent, 185 g/eq.; viscosity, 15 Pa·s/25° C.), <Phenol resin (b1)>Phenol novolak resin (hydroxyl equivalent, 106 g/eq.; softening point, 60° C.), <Phenol resin (b2)>Phenol aralkyl resin (hydroxyl equivalent, 168 g/eq.; softening point, 60° C.), <Acrylic rubber>Acrylonitrile/butadiene rubber (acrylonitrile content, 40 wt %), <Inorganic filler>Spherical silica (average particle diameter, 1 μm; maximum particle diameter, 10 μm), <Curing accelerator>Tetraphenyl phosphonium-tetra(4-methylphenyl) borate.

(Tensile Storage Elastic Modulus of the Die-Bonding Adhesive Layer)

The die-bonding adhesive layer (die-bonding film) was cut by a cutter knife into a strip of 10 mm in width, and its tensile storage elastic modulus at 0 to 50° C. at 10 Hz frequency with a solid viscoelasticity measuring instrument RSAII (manufactured by Rheometric Scientific), and the tensile storage elastic modulus at 25° C. was shown.

EXAMPLES AND COMPARATIVE EXAMPLES

The die-bonding adhesive layers A to C were attached respectively to the pressure-sensitive adhesive layers of the adhesive films A to C obtained in Production Examples 1 to 3 at 40±3° C. to give dicing die-bonding films.

(Peel Adhesive Strength)

Each of the resulting dicing die-bonding films was cut into a strip of 25 mm in width and stuck on the surface of a silicon mirror wafer (CZN<100>2.5-3.5 (4 inches) manufactured by Shin-Etsu Handotai Co., Ltd.) at 40±3° C. The strip was left in a room temperature atmosphere for 30 minutes, and then the peel adhesive strength at 15° was measured in a thermostatic chamber at 23° C. (peel point moving rate, 2.5 mm/sec.). Measurement of the adhesive strength was conducted at the region where the pressure-sensitive adhesive layer had been irradiated with UV rays. The results are shown in Table 2.

(Pickup Count)

A surface of a silicon mirror wafer (CZN<100> 2.5-3.5 (4 inches) manufactured by Shin-Etsu Handotai Co., Ltd.) was stuck on the region where the pressure-sensitive adhesive layer of the resulting dicing die-bonding film had been irradiated with UV rays, and subjected to dicing and picked up under the following conditions to evaluate whether pickup was feasible or not. Among 50 chipped wafers, the number of wafers which could be picked up is shown in Table 3.

<Dicing Conditions>Dicer manufactured by DISCO; DFD-651 blade manufactured by DISCO; number of revolutions of 27HECC blade, 40000 rpm; dicing speed, 120 mm/sec.; dicing depth, 25 μm; cut mode, down cut; dicing size, 5.0 mm×5.0 mm <Pickup Conditions>Die bonder, NEC Machinery CPS-100; number of pins; interval between 4 pins, 3.5 mm×3.5 mm; pin top curvature, 0.250 mm; pin lifting, 0.50 mm; adsorption retention time, 0.2 sec.; expansion, 3 mm.

TABLE 2

| | | 15° peel adhesive strength from the die-bonding adhesive layer (N/25 mm tape width) Die-bonding adhesive layer | | |
|---|---|---|---|---|
| | | A | B | C |
| Adhesive film (region cured with UV rays) | A | 0.8 | 1.2 | 13 |
| | B | 0.9 | 1.5 | 31 |
| | C | 3.1 | 3.7 | 0 |

TABLE 3

| | | Pickup count (number) | | |
|---|---|---|---|---|
| | | A | B | C |
| Adhesive film (region cured with UV rays) | A | 50 | 50 | 13 |
| | B | 50 | 50 | 31 |
| | C | 20 | 27 | 0 |

From Tables 2 and 3, it is recognized that the dicing die-bonding films having a peel adhesive strength of not higher than 2.3 N/25 mm are excellent in pickup properties.

The specific embodiments and examples described in the detailed description of the invention are intended to clarify the technical content of the present invention, and not be construed as limitation to the specific examples, and can be carried out in various modifications within the spirit of the present invention and the scope of the following patent claims.

What is claimed is:

1. A dicing die-bonding film having a pressure-sensitive adhesive layer on a substrate material and a die-bonding adhesive layer on the pressure-sensitive adhesive layer,
    wherein the adhesion of the pressure-sensitive adhesive layer to the die-bonding adhesive layer, as determined under the conditions of a peel angle of 15° and a peel point moving rate of 2.5 mm/sec. at 23° C., is different between a region A corresponding to a work attachment region of the die-bonding adhesive layer and a region B corresponding to a part or the whole of a region other than the work attachment region of the die-bonding adhesive layer, and satisfies the following relationship: adhesion of the region A of the pressure-sensitive adhesive layer<adhesion of the region B of the pressure-sensitive adhesive layer, and the adhesion of the region A of the pressure-sensitive adhesive layer to the die-bonding adhesive layer is not higher than 2.3 N/25 mm.

2. The dicing die-bonding film according to claim 1, wherein the adhesions of the work attachment region of the die-bonding adhesive layer to the work and to the region A of the pressure-sensitive adhesive layer satisfy the following relationship: adhesion to the work<adhesion to the region A of the pressure-sensitive adhesive layer.

3. The dicing die-bonding film according to claim 1, wherein a part of the region other than the work attachment region is a dicing ring attachment region.

4. The dicing die-bonding film according to claim 3, wherein the adhesions of the dicing ring attachment region of the die-bonding pressure-sensitive adhesive to the dicing ring and to a part of the pressure-sensitive adhesive layer corresponding to the dicing ring attachment region satisfy the following relationship: adhesion to the dicing ring<adhesion to the part of the pressure-sensitive adhesive layer.

5. The dicing die-bonding film according to claim 1, wherein the pressure-sensitive adhesive layer is formed from a radiation-curing pressure-sensitive adhesive and the region A of the pressure-sensitive adhesive layer corresponding to the work attachment region is irradiated with radiations.

6. The dicing die-bonding film according to claim 1, wherein the tensile storage elastic modulus of the die-bonding adhesive layer at 25° C. is 50 MPa or more.

7. A dicing die-bonding film having a pressure-sensitive adhesive layer on a substrate material and a die-bonding adhesive layer on the pressure-sensitive adhesive layer,
    wherein the die-bonding adhesive layer is arranged discretely as a work attachment region on a part of the pressure-sensitive adhesive layer, and the adhesion of the pressure-sensitive adhesive layer to the die-bonding adhesive layer, as determined under the conditions of a peel angle of 15° and a peel point moving rate of 2.5 mm/sec. at 23° C., is different between a region A of the pressure-sensitive adhesive layer corresponding to the work attachment region and a region B other than the region A of the pressure-sensitive adhesive layer, satisfies the following relationship: adhesion of the region A of the pressure-sensitive adhesive layer<adhesion of the region B of the pressure-sensitive adhesive layer, and the adhesion of the region A of the pressure-sensitive adhesive layer to the die-bonding adhesive layer is not higher than 2.3 N/25 mm.

8. The dicing die-bonding film according to claim 7, wherein the adhesions of the work attachment region to the work and to the region A of the pressure-sensitive adhesive layer satisfy the following relationship: adhesion to the work>adhesion to the region A of the pressure-sensitive adhesive layer.

9. The dicing die-bonding film according to claim 7, wherein the pressure-sensitive adhesive layer is formed from a radiation-curing pressure-sensitive adhesive, and the region A of the pressure-sensitive adhesive layer corresponding to the work attachment region is irradiated with radiations.

10. The dicing die-bonding film according to claim 9, wherein the radiation-curing pressure-sensitive adhesive comprises an acrylic polymer, and its glass transition temperature is −70° C. or more.

11. The dicing die-bonding film according to claim 9, wherein the radiation-curing pressure-sensitive adhesive comprises an acrylic polymer, and its weight-average molecular weight is 500,000 or more.

12. The dicing die-bonding film according to claim 11, wherein the tensile storage elastic modulus of the die-bonding adhesive layer at 25° C. is 50 MPa or more.

* * * * *

UNITED STATES PATENT AND TRADEMARK OFFICE
CERTIFICATE OF CORRECTION

| | | |
|---|---|---|
| PATENT NO. | : 7,508,081 B2 | Page 1 of 1 |
| APPLICATION NO. | : 11/082112 | |
| DATED | : March 24, 2009 | |
| INVENTOR(S) | : Takeshi Matsumura et al. | |

It is certified that error appears in the above-identified patent and that said Letters Patent is hereby corrected as shown below:

At Column 8, Lines 42-43, please delete "acryloyloxynapthalenesulfonic" and insert --acryloyloxynaphthalenesulfonic--, therefor.

At Column 17, Line 62, please delete "novolak" and insert --novolac--, therefor.

At Column 18, Line 49 (approximately), after "5.0 mm" please insert --.--.

At Column 19, Line 44, in Claim 2, please delete "work<adhesion" and insert --work>adhesion--, therefor.

At Column 20, Line 5, in Claim 5, after "adhesive" please insert --,--.

Signed and Sealed this

Sixteenth Day of March, 2010

David J. Kappos
*Director of the United States Patent and Trademark Office*